(12) United States Patent
Obata et al.

(10) Patent No.: US 9,097,768 B2
(45) Date of Patent: Aug. 4, 2015

(54) METHOD FOR TESTING AN INVERTER DRIVE ROTATING ELECTRIC MACHINE

(75) Inventors: Koji Obata, Hitachi (JP); Yutaka Higashimura, Hitachi (JP); Keiji Suzuki, Hitachi (JP)

(73) Assignee: HITACHI, LTD., Tokyo (JP)

( * ) Notice: Subject to any disclaimer, the term of this patent is extended or adjusted under 35 U.S.C. 154(b) by 315 days.

(21) Appl. No.: 13/618,147

(22) Filed: Sep. 14, 2012

(65) Prior Publication Data

US 2013/0093457 A1   Apr. 18, 2013

(30) Foreign Application Priority Data

Oct. 17, 2011   (JP) .................................. 2011-228037

(51) Int. Cl.
*G01R 31/34* (2006.01)
*G01R 31/12* (2006.01)

(52) U.S. Cl.
CPC .......... *G01R 31/343* (2013.01); *G01R 31/1227* (2013.01)

(58) Field of Classification Search
CPC .... G01R 31/343; G01R 31/34; G01R 31/346; G01R 31/025; G01R 31/024; G01R 31/021; G01R 31/1272; G01R 31/18; G01R 31/08
USPC ............ 324/765.01, 546, 528, 545, 551, 511, 324/553, 525, 536, 530; 318/800, 801, 802, 318/803, 804, 805; 310/68 R, 214, 215, 71, 310/364, 365
See application file for complete search history.

(56) References Cited

U.S. PATENT DOCUMENTS

| 4,814,699 | A | * | 3/1989 | Koziel et al. | 324/765.01 |
| 4,949,001 | A | * | 8/1990 | Campbell | 310/220 |
| 5,514,967 | A | * | 5/1996 | Zelm | 324/551 |
| 5,714,679 | A | * | 2/1998 | Nichols et al. | 73/35.08 |

(Continued)

OTHER PUBLICATIONS

Technical Report of Institute of Electrical Engineers of Japan, No. 1218, pp. 60-69.

(Continued)

*Primary Examiner* — Tung X Nguyen
*Assistant Examiner* — Thang Le
(74) *Attorney, Agent, or Firm* — Mattingly & Malur, PC

(57) ABSTRACT

With a rotating electric machine testing method for applying a test voltage to an armature winding of the rotating electric machine to thereby test insulation performance of the armature winding, in the case where a rated voltage of the armature winding of the rotating electric machine is E, and an insulation test voltage of an armature winding of a sine wave voltage drive rotating electric machine at the rated voltage E is $E/\sqrt{3}$ or E, a test voltage $V_{test}$ applied to an armature winding of the inverter drive rotating electric machine is set to $V_{test}=\alpha \cdot E/\sqrt{3}$ or $V_{test}'=\alpha \cdot E$, respectively, provided that $\alpha(=t_{inv}/t_{sin})$, if the insulation thicknesses of the sine wave drive rotating electric machine is $t_{sin}$ and of the inverter drive rotating electric machine is $t_{inv}$, thereby conducting a test on any of the AC voltage-current characteristic, AC tan δ, and AC partial-discharge characteristics.

8 Claims, 15 Drawing Sheets

(56) References Cited

U.S. PATENT DOCUMENTS

| | | | | |
|---|---|---|---|---|
| 6,114,871 | A * | 9/2000 | Shiota et al. | 324/765.01 |
| 6,452,416 | B1 * | 9/2002 | Kaneda et al. | 324/765.01 |
| 8,115,496 | B2 * | 2/2012 | Kimura | 324/551 |
| 8,803,461 | B2 * | 8/2014 | Tiwari et al. | 318/459 |
| 2005/0218907 | A1 * | 10/2005 | Lee et al. | 324/551 |
| 2008/0106157 | A1 * | 5/2008 | Higashimura et al. | 310/45 |
| 2009/0322345 | A1 * | 12/2009 | Kimura | 324/544 |
| 2010/0073012 | A1 * | 3/2010 | Inoue et al. | 324/551 |

OTHER PUBLICATIONS

Yada, Masayuki; "Modern High-Voltage Engineering", Published by Ohm Co., Ltd.; pp. 186-192.

"Electrical Joint Study", compiled by Electrical Joint Study Society, vol. 51, No. 2, pp. 59-60, 1995.

"Electrical Equipment Test Method Outline, complied by Institute of Electrical Engineers of Japan", Technical Report of Institute of Electrical Engineers of Japan; No. II, No. 18 pp. 38-49, 1972.

* cited by examiner

METHOD FOR TESTING AN INVERTER DRIVE ROTATING ELECTRIC MACHINE

FIELD OF THE INVENTION

The present invention relates to a technology for testing an inverter drive rotating electric machine and in particular to an insulation test technology for the inverter drive rotating electric machine.

BACKGROUND OF THE INVENTION

The practice of adopting a variable-speed operation of a rotating electric machine by use of an inverter is growing steadily from an energy-saving point of view in recent years. However, it has been reported (refer to "Technical Report of Institute of Electrical Engineers of Japan", No. 1218, pp. 60-69) that various problems occur with respect to insulation of the rotating electric machine in the case of driving the rotating electric machine by use of the inverter. For example, it has been reported that if an inverter surge voltage generated due to ON/OFF of a switching element inside an inverter propagates through a cable to reach an end of the rotating electric machine, this will cause the inverter surge voltage to jump at the end of the rotating electric machine caused by mismatching in serge impedance between the cable and the rotating electric machine, whereupon a voltage higher than a voltage at the time of conventional commercial frequency sine wave driving is applied to the rotating electric machine, thereby causing insulation degradation.

Further, it has been reported that upon intrusion of a steep inverter surge voltage into a rotating electric machine, a high voltage is generated between turns of a coil, on the lead side of a winding of the rotating electric machine, thereby causing insulation degradation. Further, it has also been reported that if a slot-corona preventive layer, and an electric field relaxation layer are provided on the surface of a ground insulator, there is a possibility that heat generation, and degradation occur to these layers.

Further, since a switching frequency of the inverter is in a range of several hundred Hz to 10 kHz, there is a possibility that these phenomena repeatedly occur with high frequency as compared with the case of a conventional commercial frequency sine wave driving. For such reasons described as above, with a rotating electric machine for use in inverter-driving, it is necessary to design these insulation parts so as to enable them to withstand the inverter surge voltage, and to test a rotating electric machine already completed in order to check whether or not those insulation parts can withstand a predetermined inverter surge voltage. Furthermore, it is necessary to test the inverter drive rotating electric machine even after delivery thereof in order to check whether or not abnormal insulation degradation has occurred due to application of an inverter operation voltage, thereby running a diagnosis on insulation degradation.

With a commercial frequency sine wave drive rotating electric machine, an insulation test on the ground insulation of a winding has thus far been conducted in the past, the insulation test including, for example, an AC current test, a dielectric loss tangent (tan δ) test, and a partial discharge test (refer to "Modern High-Voltage Engineering", by Masayuki Yada, Published by Ohm Co., Ltd., pp. 186-192, "Electrical Joint Study", compiled by Electrical Joint Study Society, Vol. 51, No. 2, pp. 59-60, 1995, and "Electrical Equipment Test Method Outline", complied by Institute of Electrical Engineers of Japan", Technical Report of Institute of Electrical Engineers of Japan", No. II, No. 18, pp. 38-49, 1972). More specifically, if the rated voltage of a rotating electric machine is E, a voltage $E/\sqrt{3}$ is applied against the ground (between cores) of a winding of the rotating electric machine, so that, in these tests, the voltage $E/\sqrt{3}$ as a test voltage has been applied to the ground insulation, thereby having measured the AC current, the tan δ, and the partial discharge, respectively. Further, if there exists stipulation with respect to specification, in particular, and so forth, a sine wave voltage equivalent in magnitude to the rated voltage E has been applied to the ground insulation, having thereby measured the AC current, tan δ, and the partial discharge, respectively. A measurement value from each of these tests has been evaluated in the light of a pass/fail criterion value established from the past insulation tests conducted on the commercial frequency sine wave drive rotating electric machine, thereby having determined pass/fail on an insulation state.

SUMMARY OF THE INVENTION

Now, with an inverter drive rotating electric machine system, a voltage (an overvoltage) higher than the voltage at the time of the commercial frequency driving is applied to the rotating electric machine.

FIG. 27 is a view showing a voltage waveform 141 at the time of inverter driving, and a test voltage waveform 272 at $E/\sqrt{3}$ for comparison with each other. At the time of inverter driving, a pulse voltage with spike-like steep voltages superimposed on each other is applied to the rotating electric machine, and a peak voltage of the voltage waveform 141 becomes higher than that of the test voltage waveform 272 at $E/\sqrt{3}$.

Further, even if a system is at the same rated voltage E, magnitude of the voltage as applied largely varies depending on combination of an inverter, a cable, and a rotating electric machine. For this reason, there is the case where it is not necessarily appropriate to conduct the insulation test on the ground insulation of the rotating electric machine, such as the AC current test, the dielectric loss tangent (tan δ) test, the partial discharge test, and so forth, across the board, by use of the test voltage ($E/\sqrt{3}$ or E) based on the conventional rated voltage E.

Further, with the inverter drive rotating electric machine, it has been a general practice to design an insulation thickness to be larger than that in the case of the commercial frequency sine wave drive rotating electric machine in consideration of insulation degradation accompanying an overvoltage, and accelerated insulation degradation accompanying repetition in overvoltage application. If the insulation test using the test voltage ($E/\sqrt{3}$ or E) based on the conventional rated voltage is applied to an inverter drive rotating electric machine designed to be larger in insulation thickness, as described above, it is not rational to use pass/fail criteria of the insulation test such as the AC current test, the dielectric loss tangent (tan δ), the partial discharge test, and so forth, established from the past measurements taken on the basis of the rated voltage E of the commercial frequency drive rotary electric machine.

Further, there is a possibility that insulation degradation occurs to an insulation between turns, the slot-corona preventive layer, and the electric field relaxation layer when the inverter surge voltage is applied, as described above, however, in the conventional insulation test using $E/\sqrt{4}$ or the sine wave voltage equivalent in magnitude to the rated voltage E, as the test voltage, it is not possible to inspect these insulation parts.

In view of these problems, the present invention has been developed, and it is therefore an object of the invention to provide an insulation test method suited to an inverter drive rotating electric machine, and to provide guidelines for manufacture of a rotating electric machine, and diagnosing insulation degradation.

In order to solve the problems, the following means are adopted.

In accordance with one aspect of the invention, there is provided a rotating electric machine testing method whereby a test voltage is applied to an armature winding of a rotating electric machine, and insulation performance of the armature winding is tested. In the case where a rated voltage of the armature winding of the rotating electric machine is E, and an insulation test voltage of an armature winding of a sine wave voltage drive rotating electric machine at the rated voltage E is $E/\sqrt{3}$ or E, a test voltage $V_{test}$ applied to an armature winding of an inverter drive rotating electric machine is set to $V_{test}=\alpha \cdot E/\sqrt{3}$ or $V_{test}'=\alpha \cdot E$, respectively, provided that $\alpha(=t_{inv}/t_{sin})$ if an insulation thickness $t_{sin}$ of the sine wave-drive rotating electric machine is $t_{sin}$, and an insulation thickness of the inverter drive rotating electric machine is $t_{inv}$, thereby testing any of an AC voltage-current characteristic, an AC tan δ characteristic, and an AC partial-discharge characteristic.

As the present invention is provided with a configuration described as above, the invention can provide the insulation test method suited to the inverter drive rotating electric machine, and to provide the guidelines for manufacture of the rotating electric machine, and diagnosing the insulation degradation.

DETAILED DESCRIPTION OF THE PREFERRED EMBODIMENTS

Preferable embodiments of the invention are hereinafter described with reference to the accompanying drawings.

First Embodiment

Figure 1:
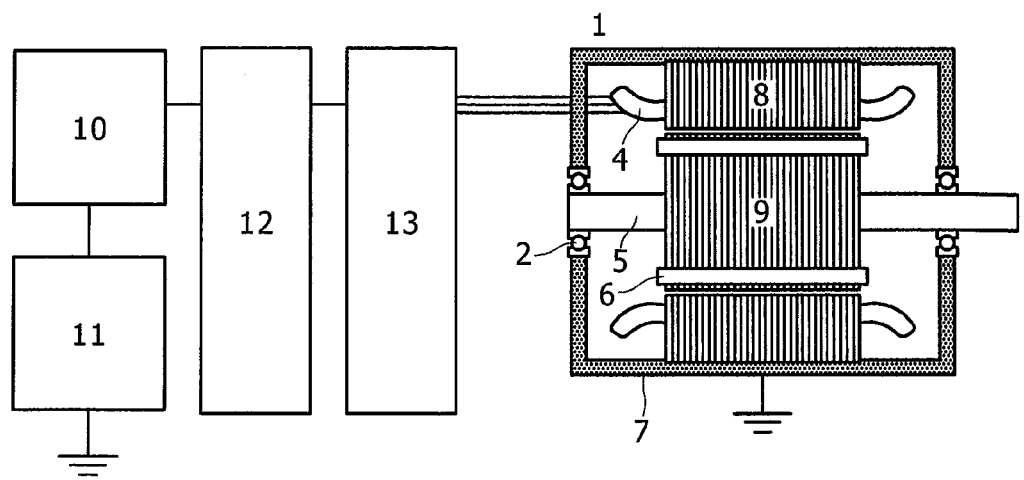
FIG. 1 is a view showing a configuration of both an insulation test system, and an inverter rotating electric machine, according to a first embodiment of the invention.

FIG. 1 is a view showing a configuration of both an insulation test system, and an inverter rotating electric machine, according to a first embodiment of the invention. A rotating electric machine 1 is provided with a stator 8, and a rotor 9. A stator winding (an armature winding) 4 is inserted in the stator 8. A rotating magnetic field is generated by the agency of the stator winding. The rotor 9 is rotated according to the rotating magnetic field as generated. A shaft 5 is penetrated through the rotor 9, which is supported by bearings 2, and a housing 7. Further, in the case of an induction motor, a secondary wiring is provided at 6 of the rotor, and in the case of a synchronous motor, and a field winding or a permanent magnet is provided at 6 of the rotor.

Meanwhile, the insulation test system is made up by connecting a sine wave power supply 10 in series to an impulse power supply 11, and is capable of outputting three kinds of voltages, namely, a sine wave voltage, a superimposed voltage including the sine wave voltage with an impulse superimposed thereon, and an impulse voltage.

An insulation characteristic measuring instrument 12 is connected to an output terminal of the power supplies connected in series, at least one of an AC ammeter, a tan δ measuring instrument, and a partial-discharge measuring instrument, being integrated in the insulation characteristic measuring instrument 12. Application of a test voltage to the rotating electric machine together, and values of insulation characteristics, such as an AC characteristic, a tan δ characteristic, and a partial-discharge characteristic, and so forth, are measured by the insulation characteristic measuring instrument 12.

Further, an interconnection switching mechanism 13 switches an output interconnection of the insulation test system over to one phase (a test phase) selected out of three phases such as U, V, W phases of the rotating electric machine, or R, S, T phases of a generator, and so forth, to be connected thereto, thereby applying the test voltage to the test phase as selected.

Figure 2:
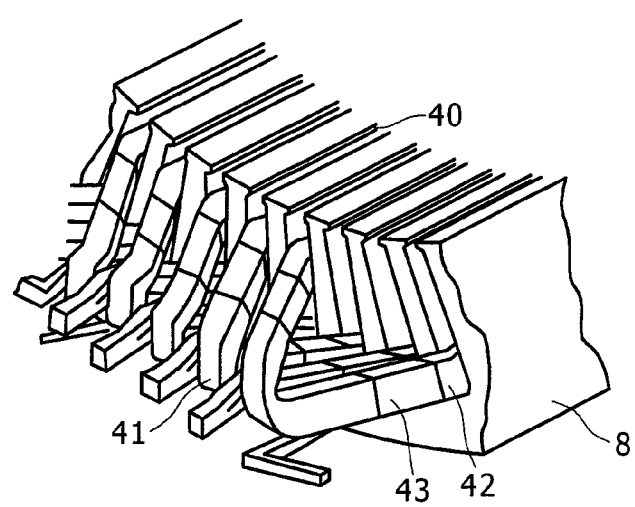
FIG. 2 is a view showing a part of a stator of a rotating electric machine, as seen from the axial direction thereof.

FIG. 2 is a view showing a part of the stator of the rotating electric machine, as seen from the axial direction thereof. A stator winding 41 is inserted in a slot 40 of the stator 8. A slot-corona preventive layer 42 and an electric field relaxation layer 43 for relaxing convergence of electric fields at an end of the slot-corona preventive layer are provided on the surface of a ground insulation of a coil at a coil end part extended from the slot, in the axial direction thereof.

Figure 3:
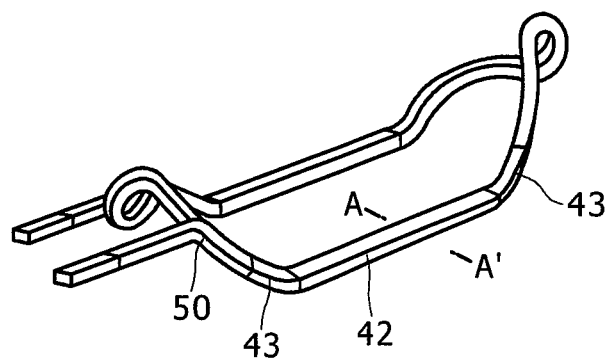
FIG. 3 is an external view showing a coil (a diamond coil) as a constituent of a stator winding 41 shown in FIG. 2.

FIG. 3 is an external view showing the coil (a diamond coil) as a constituent of the stator winding 41 shown in FIG. 2. A stator coil is provided with a ground insulation 50 for insulating a coil conductor from a core. The slot-corona preventive layer 42 is provided on the surface of the ground insulation of a straight-line part of the coil, housed in the slot. Further, the electric field relaxation layer 43 for relaxing convergence of the electric fields is provided at the end of the slot-corona preventive layer. In this case, the diamond coil is shown, however, a half-coil is obtained by dividing the diamond coil at an end of the stator, in the axial direction thereof, and two pieces of the half-coils can be connected to each other, thereby making up a coil.

Figure 4:
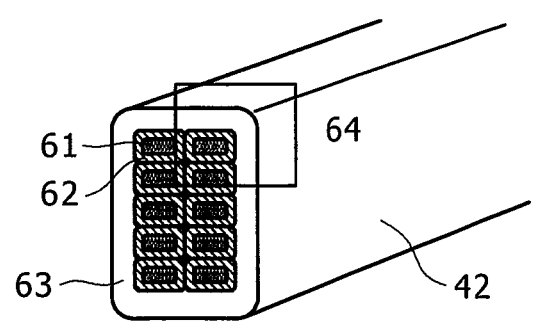
FIG. 4 is a sectional view of the coil, taken on line A-A' of FIG. 3.

FIG. 4 is a sectional view of the stator coil taken on line A-A' of FIG. 3. In the stator coil, an insulation between turns 62, for effecting insulation between turn conductors, is provided on the surface of a turn conductor 61, a current for generating a rotating magnetic field, flowing therethrough. A number of insulation-covered conductors provided with the insulation between turns, respectively, corresponding to several turns, are gathered, and subsequently, the outer periphery of a cluster of the insulation-covered conductors is covered with a ground insulation 63, thereby effecting insulation between the conductors and the stator core. The slot-corona preventive layer 42 is provided on the surface of the ground insulation 63.

Figure 5:
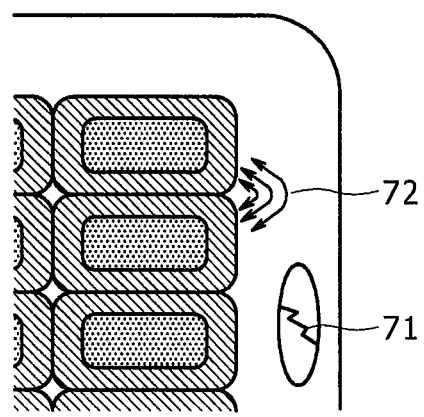
FIG. 5 is view showing an instance of occurrences of partial discharges when the rotating electric machine is driven by the inverter.

FIG. 5 is view showing an instance of partial discharges occurring to the ground insulation, and the insulation between turns, respectively, when the rotating electric machine is driven by the inverter. At the time of inverter driving, a partial discharge 71 occasionally occurs to a void in the ground insulation by the agency of an inverter surge voltage at a high voltage. Further, upon a steep inverter surge voltage being applied to a coil of the rotating electric machine, a partial discharge 72 occurs between the turn conductors. An insulation layer undergoes degradation due to these partial discharges. Accordingly, it is necessary to correctly measure partial discharge characteristics of these insulation parts for evaluation thereof.

Figure 6:
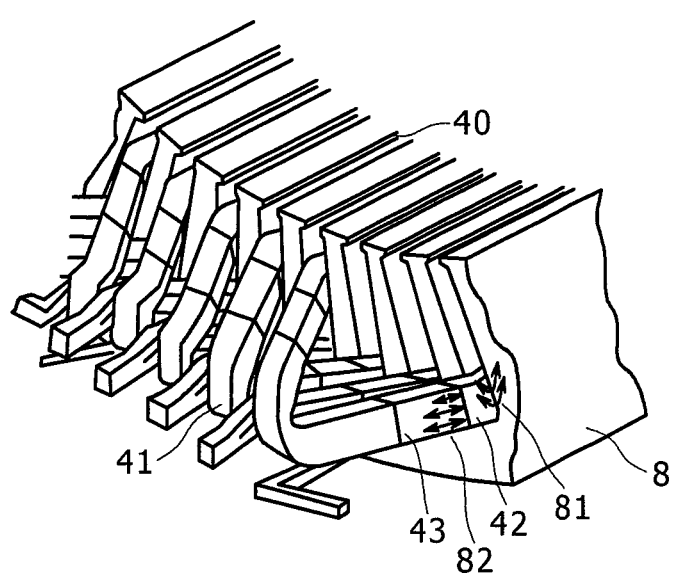
FIG. 6 is view showing occurrences of partial discharges when the rotating electric machine is driven by the inverter.

FIG. 6 is view showing partial discharges occurring to the slot-corona preventive layer, and the electric field relaxation layer, respectively, when the rotating electric machine is drive by the inverter. If a steep inverter surge voltage is applied to a winding of the rotating electric machine, this will prevent the slot-corona preventive layer 42, or the electric field relaxation layer 43 from satisfactorily functioning, so that partial discharges 81, 82 occasionally occur to the surface of the slot-corona preventive layer 42, and the surface of the electric field relaxation layer 43, respectively. Further, there is also the case where these insulation parts generate heat by the agency of a high-frequency displacement current to be burnt, thereby causing further occurrences of the partial discharges 81, 82, respectively. There is no denying a possibility of reaching a vicious cycle in that the insulation layer undergoes degradation due to those partial discharges, thereby causing further occurrences of partial discharges. It is therefore necessary to correctly measure the partial discharge characteristics of those insulation parts for evaluation.

Figure 7:
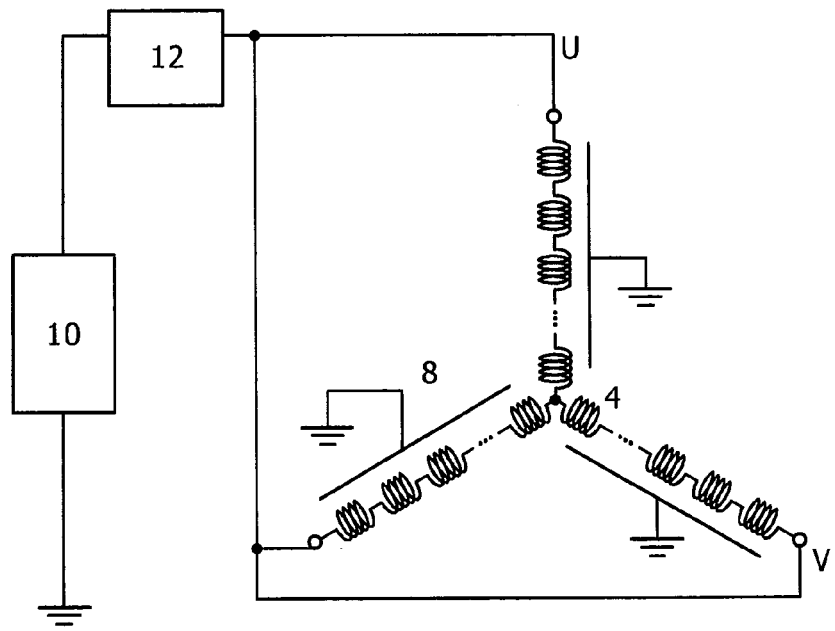
FIG. 7 is a view showing a circuit for use in a ground insulation test.

FIG. 7 is a view showing a circuit for use in a ground insulation test conducted on an inverter drive rotating electric machine as a test subject. The sine wave power supply 10 is used as a test power supply in a test on the ground insulation. With this voltage applied to three-phase (U, V, W phases) windings combined-cores (between grounds), a measurement using the insulation characteristic measuring instrument 12 is made on the AC current characteristic, the tan δ characteristic, and the partial-discharge characteristic, respectively, of the ground insulation.

With the inverter drive rotating electric machine according to the present embodiment, assuming that a rated voltage of equipment is E, and a ratio of an insulation thickness $t_{inv}$ of an inverter drive rotating electric machine to an insulation thickness $t_{sin}$ of a sine wave drive rotating electric machine at the same rated voltage as above is $\alpha(=t_{inv}/t_{sin})$ use is made of a sine wave rms value voltage not less than $$V_{test} = \alpha \cdot e/\sqrt{3} \quad (1)$$

as a test voltage in place of a conventional test voltage $E/\sqrt{3}$.

Further, for a test using the rated voltage E, use is made of a sine wave rms value voltage not less than $$V_{test}' = \alpha \cdot E \quad (2)$$

as a test voltage.

If the test voltage described as above is set, this will mean that the same electric field as an electric field applied to the ground insulation at the time of the ground insulation test on the conventional commercial frequency sine wave drive rotating electric machine is applied to the insulation layer. Accordingly, with the use of the pass/fail criterion value as it is, established from the insulation tests on the conventional commercial frequency sine wave drive rotating electric machine, as a test subject, the ground insulation test can be conducted on the inverter drive rotating electric machine.

The principle underlying the present invention is described hereinafter. The inverter surge voltage at a high voltage is applied to the inverter drive rotating electric machine. Further, with an inverter having an output voltage waveform fewer in the number of levels, a recurring pulse voltage waveform largely differing in frequency from a sine wave waveform is applied to the rotating electric machine, so that frequency-acceleration insulation-degradation, accompanying recurrence of the inverter surge voltage, becomes pronounced. For these reasons, with the commercial frequency sine wave drive rotating electric machine, the insulation thickness is generally designed to have an insulation thickness larger than that of the commercial frequency sine wave drive rotating electric machine in order to obtain the same service life as in the past.

For this reason, in the case of a rotating electric machine having an insulation thickness designed to be larger than that of the conventional commercial frequency sine wave drive rotating electric machine at the same rated voltage, if the voltage described as above (an α-multiple voltage) is used as the test voltage, a test can be conducted on the inverter drive rotating electric machine by use of the pass/fail criterion value established from the past insulation tests on the commercial frequency sine wave drive rotating electric machine.

Figure 8:
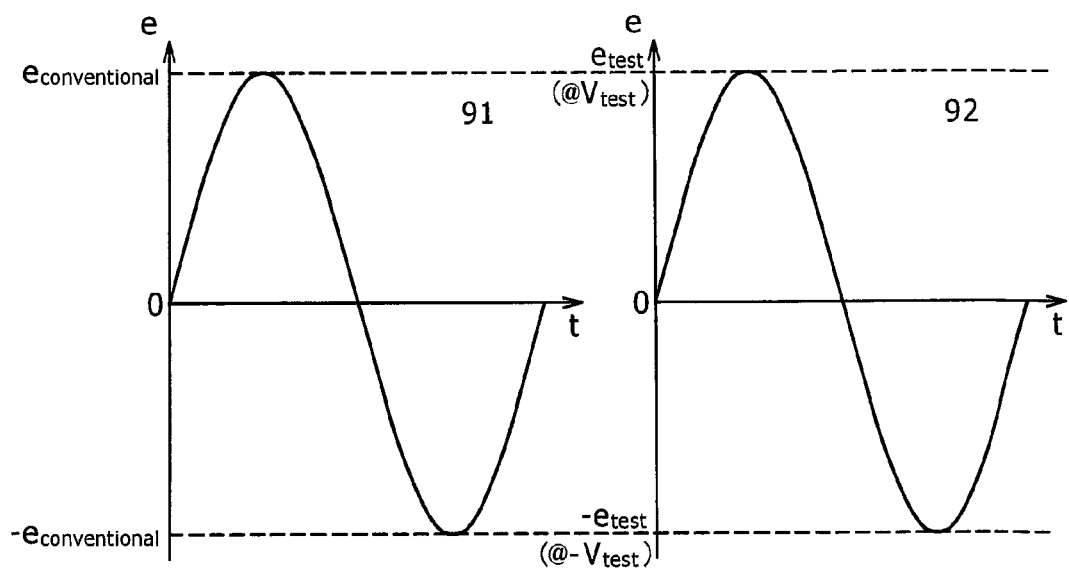
FIG. 8 is a view showing an example of an electric field applied to an insulation object at the time of the ground insulation test shown in FIG. 7.

FIG. 8 is a view showing an example of the electric field applied to an insulation object at the time of the ground insulation test shown in FIG. 7. In FIG. 8, reference numeral 91 indicates an electric field $e_{conventional}$ applied to the insulation layer at the time of the ground insulation test on the conventional commercial frequency sine wave drive rotating electric machine while reference numeral 92 indicates a sine wave electric field $e_{test}$ applied to the ground insulation when the test voltage according to the present embodiment of the invention is applied at the ground insulation test on the inverter drive rotating electric machine. In the case where a voltage at the test voltage $V_{test}$ meeting respective relationships shown in those expressions {expression (1), expression (2)} is applied, the electric field $e_{test}$ is applied to a ground insulation layer of the inverter drive rotating electric machine, the electric field $e_{test}$ being equivalent in magnitude to the electric field $e_{conventional}$ applied to a ground insulation layer at the time of the insulation test on the conventional commercial frequency sine wave drive rotating electric machine.

For this reason, even in the case of the inverter rotating electric machine, it is possible to accurately measure a defect (for example, exfoliation, void, crack) inside the ground insulation, as shown at 71 in FIG. 5, and the partial discharge occurring thereto. Further, it becomes possible to conduct a test using the pass/fail criterion for the ground insulation test on the conventional commercial frequency sine wave drive rotating electric machine.

Effects of the first embodiment of the invention are described hereinafter with reference to FIGS. 9 to 11.

Figure 9:
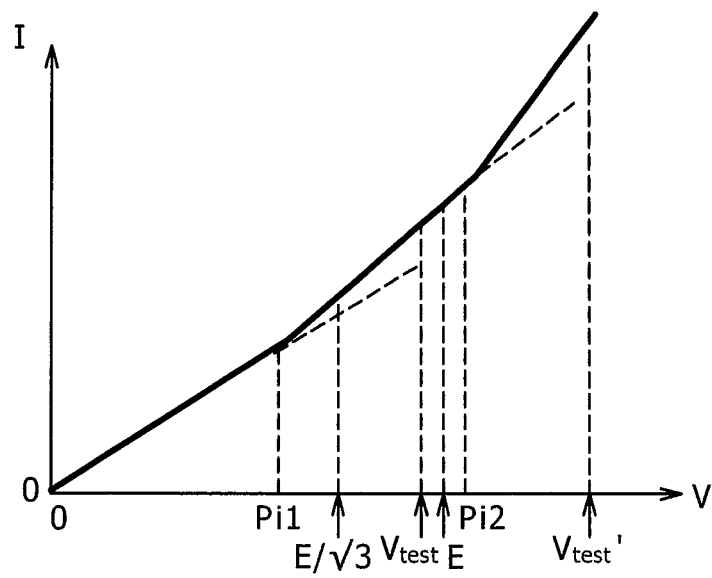
FIG. 9 is a view showing an example of an AC current-voltage characteristic.

FIG. 9 is a view showing the AC current-voltage characteristic by way of example. The horizontal axis indicates an rms value of an applied voltage, and the vertical axis indicates a measured current. Pi1 denotes a first current surge point, and Pi2 denotes a second current surge point. In FIG. 9, a voltage at Pi2 is higher than $E/\sqrt{3}$ and E, respectively, so that this armature coil can pass the test according to the pass/fail criterion described in "Electrical Joint Study", compiled by Electrical Joint Study Society, Vol. 51, No. 2, pp. 59-60, 1995. Further, since a test voltage at $E/\sqrt{3}$ or E, or more is not applied to the ground insulation, the voltage at Pi2 is not measured.

However, these test voltage levels each are lower than a voltage actually applied to the ground insulation layer of the rotating electric machine at the time of the inverter driving. If the insulation thickness of the rotating electric machine is designed to be on a lager side in consideration of the inverter-driving, the electric field applied to the ground insulation layer will become lower than the electric field applied to the ground insulation layer at the time of the insulation test on the conventional commercial frequency sine wave drive rotating electric machine. As a result, according to the conventional test method, an apparent insulation characteristic of a winding of the rotating electric machine is determined as passing the test, however, this means that correct evaluation has not, in reality, been made.

In contrast, in the case of a test conducted by applying the test voltage according to the present embodiment $V_{test}$ or $V_{test}'$, decided by taking the ratio of the insulation thickness of the inverter drive rotating electric machine to the insulation thickness of the conventional sine wave drive rotating electric machine into consideration, the voltage at the second current surge point Pi2 of the armature coil, shown in FIG. 9, can be measured. The voltage at the second current surge point Pi2 is lower than $V_{test}'$ ($\alpha \cdot E$) corresponding to the rated voltage E, although the same is higher than $V_{test}(\alpha \cdot E/\sqrt{3})$, corresponding to the test voltage $E/\sqrt{3}$ at the time of the conventional commercial frequency sine wave driving.

In the light of the pass/fail criterion established from the insulation tests conducted on the commercial frequency sine wave drive rotating electric machine, as the test subject (refer to "Electrical Joint Study", compiled by Electrical Joint Study Society, Vol. 51, No. 2, pp. 59-60, 1995), this armature coil is determined as failed because the voltage at the second current surge point Pi2 is lower than $V_{test}'$ ($\alpha \cdot E$) corresponding to the rated voltage E of the conventional commercial frequency sine wave drive rotating electric machine.

That is, this shows that the inverter drive rotating electric machine using the coil described as above is unable to maintain reliability equivalent to that of the conventional commercial frequency sine wave drive rotating electric machine.

With the present embodiment, since the test voltage $V_{test}$ ($\alpha E/\sqrt{3}$) or $V_{test}'$ ($\alpha E$), suited to the inverter drive rotating electric machine, is used as described above, a rotating electric machine suitable for inverter driving can be provided by removing a coil having such insufficient insulation described as above.

Figure 10:
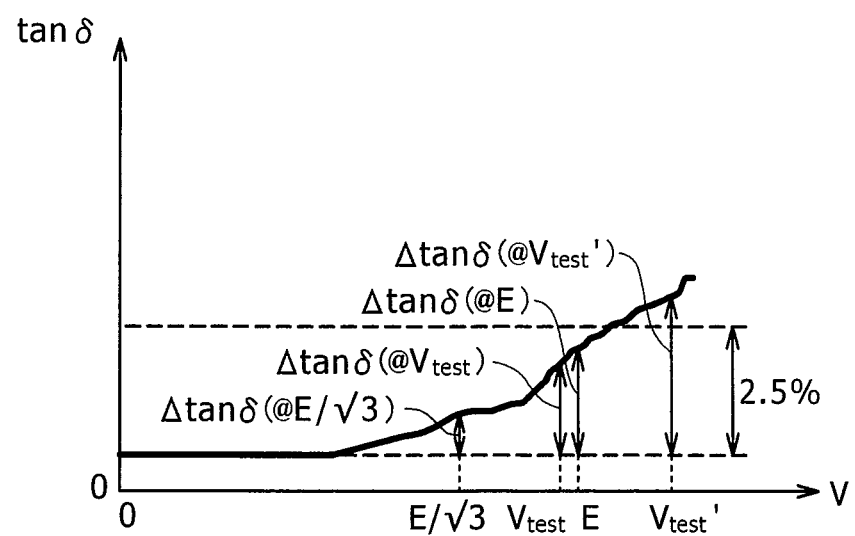
FIG. 10 shows an example of a dielectric loss tangent (tan δ)-voltage characteristic.

FIG. 10 shows an example of a dielectric loss tangent (tan $\delta$)-voltage characteristic. The test voltage based on the rated voltage E is $E/\sqrt{3}$ or E, and an increment of tan $\delta$ at these test voltages becomes $\Delta$ tan $\delta$ (@$E/\sqrt{3}$), or $\Delta$ tan $\delta$ (@E). In FIG. 10, a value of each of these increments is less than 2.5%, so that according to the pass/fail criterion described in "Electrical Joint Study", compiled by Electrical Joint Study Society, Vol. 51, No. 2, pp. 59-60, 1995, this armature coil is determined as passing the test.

However, these test voltage levels each are lower than a voltage actually applied to the ground insulation layer of the rotating electric machine at the time of the inverter driving. Further, if the insulation thickness of the rotating electric machine is designed to be on a lager side in consideration of the inverter-driving, the electric field applied to the ground insulation layer will become lower than the electric field applied to the ground insulation layer at the time of the insulation test on the conventional commercial frequency sine wave drive rotating electric machine. As a result, according to the conventional test method, an apparent insulation characteristic of a winding of the rotating electric machine is determined as passing a test, however, this means that correct evaluation has not, in reality, been made.

In contrast, in the case of a test conducted by applying the test voltage $V_{test}$ ($\alpha E/\sqrt{3}$) or $V_{test}'$ ($\alpha E$), according to the present embodiment, decided by taking the ratio of the insulation thickness of the inverter drive rotating electric machine to the insulation thickness of the conventional sine wave drive rotating electric machine into consideration, the increment of tan $\delta$ becomes $\Delta$ tan $\delta$ (@$V_{test}$), or $\Delta$ tan $\delta$ (@$V_{test}'$), larger than the $\Delta$ tan $\delta$ (@$E/\sqrt{3}$), or the $\Delta$ tan $\delta$ (@E), respectively, the latter representing the tan $\delta$ based on the rated voltage E. Further, in FIG. 10, the $\Delta$ tan $\delta$ (@$V_{test}'$) at $V_{test}'$ corresponding to the rated voltage E at the time of driving the conventional commercial frequency sine wave drive rotating electric machine is not less than 2.5%, which is in excess of the pass/fail criterion established from the insulation tests on the conventional commercial frequency sine wave drive rotating electric machine, as described in "Electrical Joint Study", compiled by Electrical Joint Study Society, Vol. 51, No. 2, pp. 59-60, 1995. This shows that the inverter drive rotating electric machine using the coil described as above is unable to maintain reliability equivalent to that of the conventional commercial frequency sine wave drive rotating electric machine in the light of a performance track record.

With the present embodiment, since the test voltage $V_{test}$ or $V_{test}'$, suited to the inverter drive rotating electric machine, is used as described above, a rotating electric machine suitable for inverter-driving can be provided by removing the coil having such insufficient insulation described as above.

In the dielectric loss tangent (tan δ) test on the conventional sine wave drive rotating electric machine, as described in "Electrical Joint Study", compiled by Electrical Joint Study Society, Vol. 51, No. 2, pp. 59-60, 1995, the Δ tan δ at the rated voltage E is used as the pass/fail criterion, however, in the case where the Δ tan δ at $E/\sqrt{3}$ is used as the pass/fail criterion, the Δ tan δ ($@V_{test}$) at $V_{test}$, corresponding to the test voltage $E/\sqrt{3}$ at the time of driving the conventional sine wave drive rotating electric machine, is preferably compared with pass/fail determination at that time.

Figure 11:
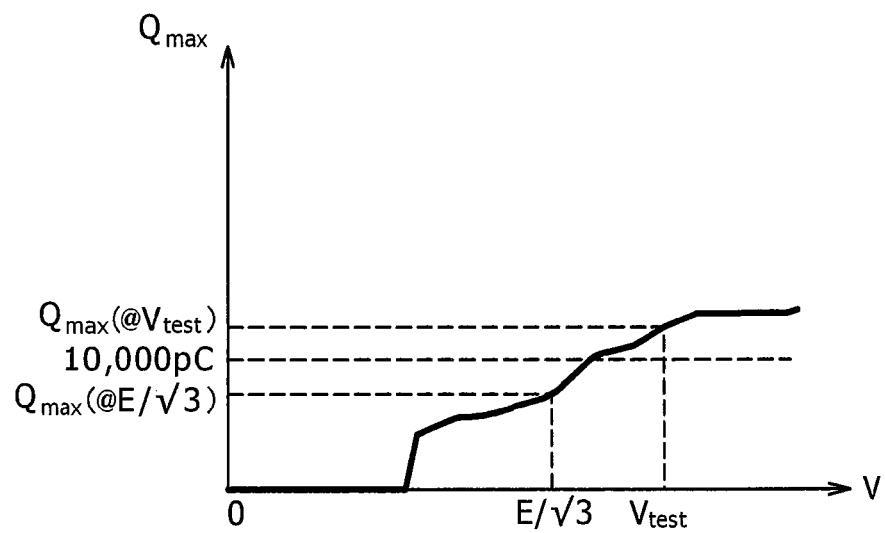
FIG. 11 is a view showing an example of a maximum partial discharge charge amount-voltage characteristic.

FIG. 11 is a view showing a maximum partial discharge charge amount-voltage characteristic by way of example. A test voltage based on a rated voltage E is $E/\sqrt{3}$, and the maximum partial discharge charge amount at the test voltage is Qmax ($@E/\sqrt{3}$). In FIG. 11, since the maximum partial discharge charge amount is less than 10,000 μC, this armature coil can pass the test according to the pass/fail criterion described in "Electrical Joint Study", compiled by Electrical Joint Study Society, Vol. 51, No. 2, pp. 59-60, 1995. However, these test voltage levels each are lower than a voltage actually applied to the ground insulation layer of the rotating electric machine at the time of the inverter driving. Further, if the insulation thickness of the rotating electric machine is designed to be on a lager side in consideration of the inverter-driving, the electric field applied to the ground insulation layer will become lower than the electric field applied to the ground insulation layer at the time of the insulation test on the conventional commercial frequency sine wave drive rotating electric machine. As a result, according to the conventional test method, an apparent insulation characteristic of a winding of the rotating electric machine is determined as passing the test, however, this means that correct evaluation has not, in reality, been made.

In contrast, in the case of a test conducted by applying the test voltage according to the present embodiment, namely, that is, $V_{test}$ ($E/\sqrt{3}$), decided by taking the ratio of the insulation thickness of the inverter drive rotating electric machine to the insulation thickness of the conventional sine wave drive rotating electric machine into consideration, the maximum partial discharge charge amount will become Qmax ($@V_{test}$). In FIG. 11, this value exceeds 10,000 μC, and is in excess of the pass/fail criterion established from the insulation tests on the conventional commercial frequency sine wave drive rotating electric machine, as described in "Electrical Joint Study", compiled by Electrical Joint Study Society, Vol. 51, No. 2, pp. 59-60, 1995. This shows that in the light of the past performance record, the inverter drive rotating electric machine using the coil described as above is unable to maintain reliability equivalent to that of the conventional commercial frequency sine wave drive rotating electric machine.

With the present embodiment, since the test voltage $V_{test}$ or $V_{test}'$, suited to the inverter drive rotating electric machine, is used, a rotating electric machine suitable for inverter-driving can be provided by removing the coil having such insufficient insulation described as above.

Figure 12:
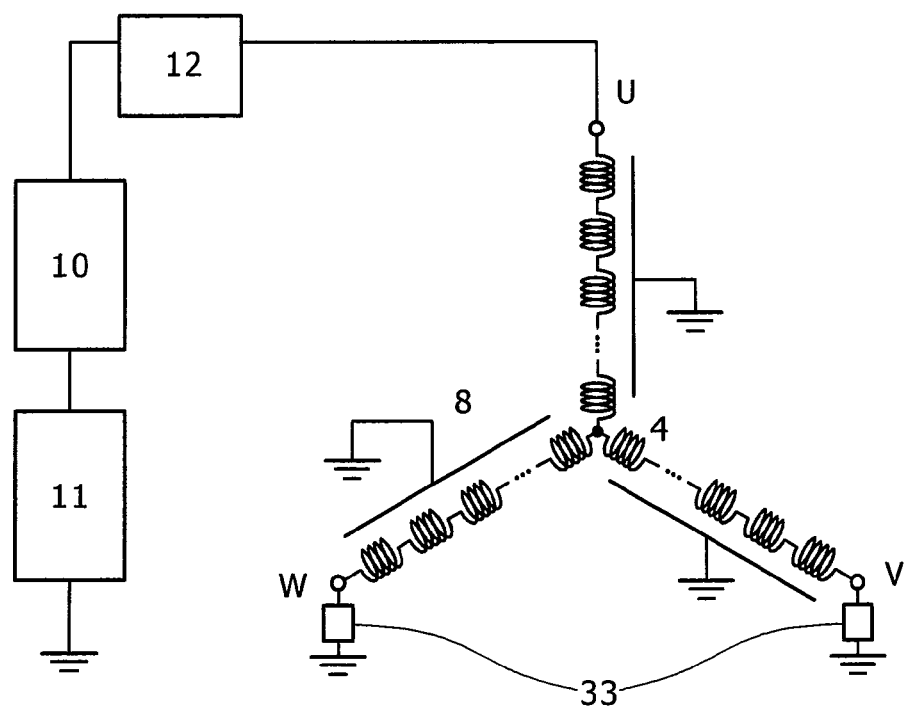
FIG. 12 is a view showing a test circuit for testing constituent parts of the inverter drive rotating electric machine, including a corona preventive layer, an electric field relaxation layer, and an insulation between turns, respectively.

FIG. 12 is a view showing a test circuit for testing constituent parts of the inverter drive rotating electric machine, including the corona preventive layer, the electric field relaxation layer, and the insulation between turns, respectively. In this case, for the test power supply, use is made of the sine wave power supply 10, and the impulse power supply 11. This voltage is applied between a selected test phase-core (in the figure, between the U phase-core). On the other hand, the V, W phases each are grounded via a resistor 33.

Figure 13:
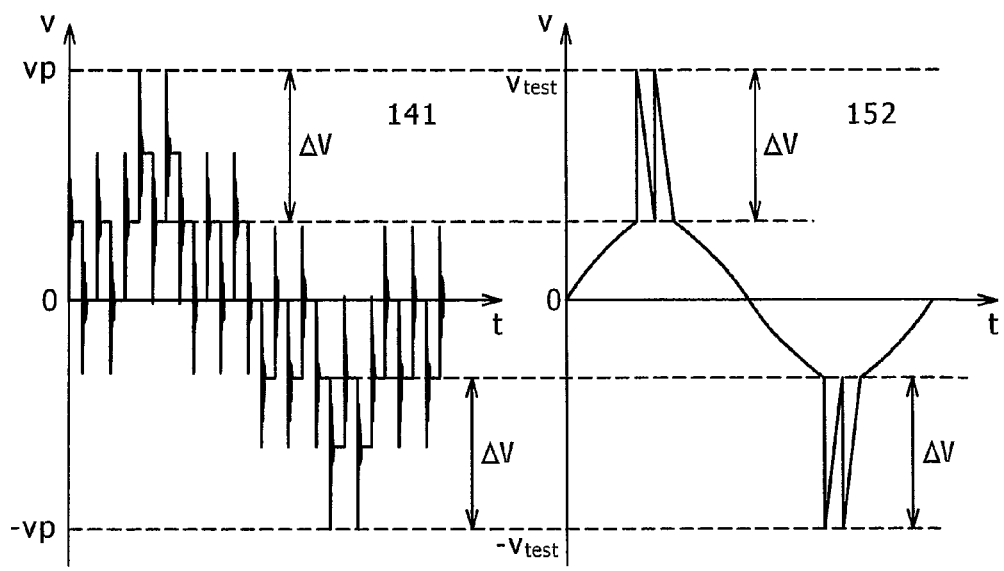
FIG. 13 is a view showing a test voltage waveform for use in an insulation test on the slot-corona preventive layer as well as the electric field relaxation layer of the inverter drive rotating electric machine.

FIG. 13 is a view showing a test voltage waveform for use in an insulation test on the slot-corona preventive layer as well as the electric field relaxation layer of the inverter drive rotating electric machine. Reference numeral 141 denotes a ground voltage waveform applied to the inverter drive rotating electric machine. Reference numeral 152 denotes a test voltage waveform used in the insulation test on the slot-corona preventive layer as well as the electric field relaxation layer of the inverter drive rotating electric machine.

At the test voltage shown in FIG. 8, and tests shown in FIGS. 9 to 11, respectively, only the sine wave voltage is used as the test voltage. Accordingly, partial discharge cannot be measured by applying a voltage equivalent to that at the time of the inverter driving to the slot-corona preventive layer or the electric field relaxation layer, posing a problem at the time of the inverter driving.

In contrast, with the present embodiment, as shown in FIG. 13, an inverter waveform 141 is separated into a steep voltage component ΔV, and a base low-frequency voltage component supporting the steep voltage component ΔV, and a voltage waveform 152 formed by superimposing these components one on top of the other is used as a test voltage. Accordingly, a distribution of respective voltages applied to the slot-corona preventive layer, and the electric field relaxation layer, at the time of the inverter driving, can be simulated. As a result, accurate measurements on partial discharges occurring to the slot-corona preventive layer, and the electric field relaxation layer, posing the problem at the time of the inverter driving, respectively, can be made by application of the test voltage shown in FIG. 13.

Figure 14:
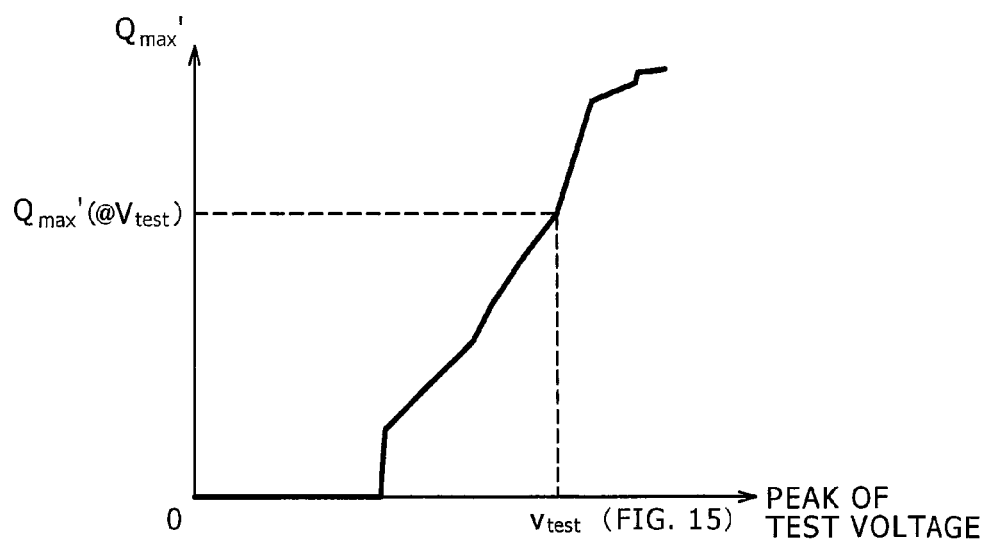
FIG. 14 is a view showing a characteristic of test voltage-partial discharge charge amount.

FIG. 14 is a view showing a characteristic of test voltage-partial discharge charge amount, obtained in the case where the test voltage shown in FIG. 13 is applied.

Further, in the case where the partial discharge does not occur, or is hard to occur to the slot-corona preventive layer, or the electric field relaxation layer of the inverter drive rotating electric machine as a test subject, there is a possibility that the partial discharge first occurs to the ground insulation layer rather than to the slot-corona preventive layer, and the electric field relaxation layer, respectively. Further, because the steep voltage component ΔV of the test voltage shown in FIG. 13 is identical in magnitude to ΔV of each of test voltages 162, 172, 182, shown in FIGS. 15 to 17, respectively, described later on in the present specification, if the partial discharge does not occur, or is hard to occur to the slot-corona preventive layer, or the electric field relaxation layer of the inverter drive rotating electric machine as the test subject, there is a possibility that the partial discharge first occurs to the insulation between turns Accordingly, if partial discharge is measured at the waveform shown in FIG. 13 (or an actual inverter voltage waveform), there arises a problem in that appropriate discrimination must be made whether the partial discharge as measured is the partial discharge occurring to the slot-corona preventive layer, or the partial discharge occurring to the electric field relaxation layer, otherwise the partial discharge occurring to others such as the ground insulation, or the insulation between turns. A method for this discrimination is described later on.

Figure 15:
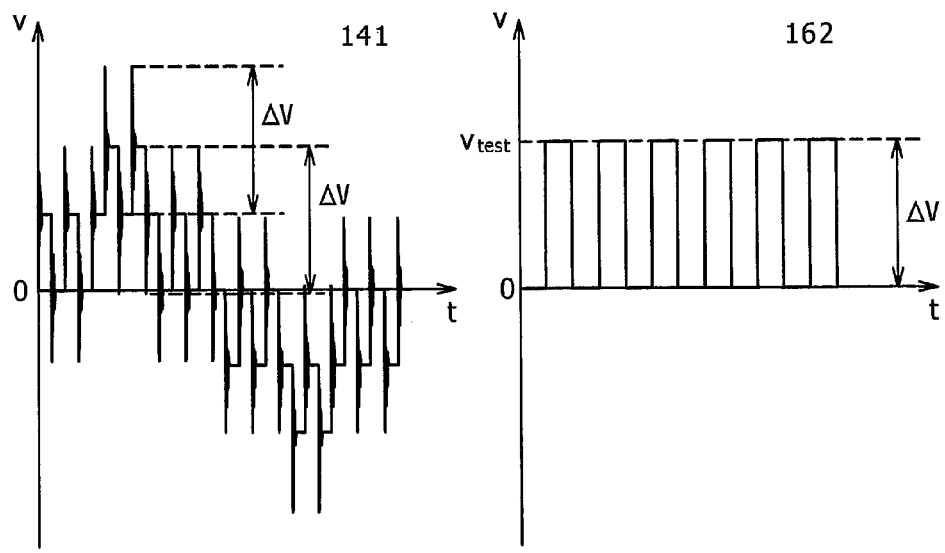
FIG. 15 is a view showing a test voltage waveform for use in the insulation test on the insulation between turns of the inverter drive rotating electric machine.
Figure 16:
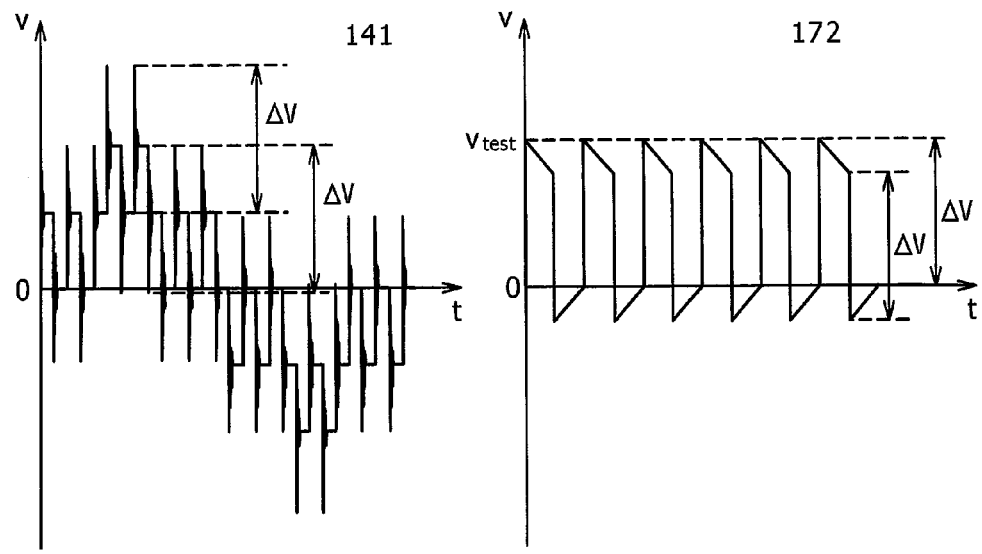
FIG. 16 is a view showing another test voltage waveform for use in the insulation test on the insulation between turns of the inverter drive rotating electric machine.
Figure 17:
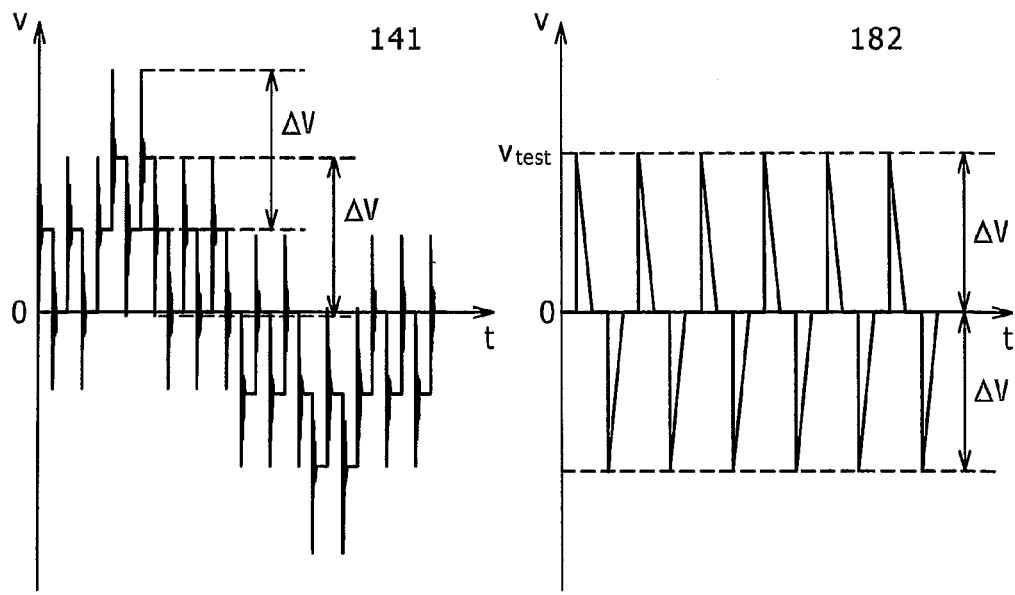
FIG. 17 is a view showing still another test voltage waveform for use in the insulation test on the insulation between turns of the inverter drive rotating electric machine.

FIGS. 15 to 17 each show a test voltage waveform for use in the insulation test on the insulation between turns of the inverter drive rotating electric machine. In these figures, reference numeral 141 denotes a ground voltage waveform applied to the inverter drive rotating electric machine. Reference numeral 162 denotes a rectangular pulse voltage, reference numeral 172 denotes a voltage waveform a in the case where the apex of the rectangular pulse voltage 162 gradually falls with time, and reference numeral 182 denotes a voltage waveform in the case where the apex of the rectangular pulse voltage 162 further falls down to 0 V (in the case of large LC resonant vibration, the apex of the rectangular pulse voltage 162 can gradually fall down below 0 V at times).

Figure 18:
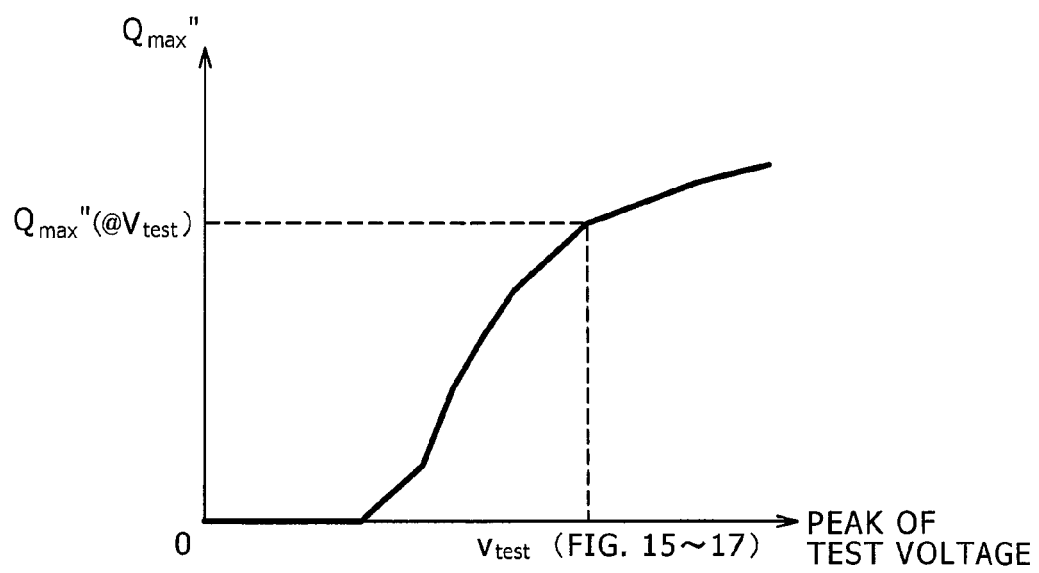
FIG. 18 is a view showing another characteristic of test voltage-partial discharge charge amount.

For the test voltage shown in FIG. 8, and the tests shown in FIGS. 9 to 11, respectively, the sine wave voltage at a low frequency is used as the test voltage, so that partial discharge cannot be measured by applying a voltage equivalent to that at the time of the inverter driving to the insulation between turns, posing a problem at the time of the inverter driving. In contrast, with the present invention, because use is made of the test voltage waveforms 162, 172, 182, simulating the respective steep voltage variations $\Delta V$ of the inverter waveform 141, both positive and negative, in polarity, it is possible to simulate a distribution of voltages generated at the insulation between turns by the agency of the steep voltage variations $\Delta V$. As a result, the partial discharge occurring to the insulation between turns, posing the problem at the time of the inverter driving, can be accurately measured by the test voltage according to the present embodiment. Accordingly, there is obtained a view showing such a characteristic of test voltage-partial discharge charge amount as shown in FIG. 18.

Further, any of the test voltage waveforms 162, 172, 182, shown in FIGS. 15 to 17, respectively, is smaller in magnitude than the test voltage shown in FIG. 13, and the ground voltage 141 at the time of the inverter driving. For this reason, it is possible to reduce the test voltage applied to the ground insulation only while reducing test voltages applied to the ground insulation, the slot-corona preventive layer, and the electric field relaxation layer, respectively.

Next, there is described a method for discriminating between partial discharges measured when the test voltage waveform shown in FIG. 13 (or the actual inverter voltage waveform) is applied to a winding of the rotating electric machine.

Figure 19:
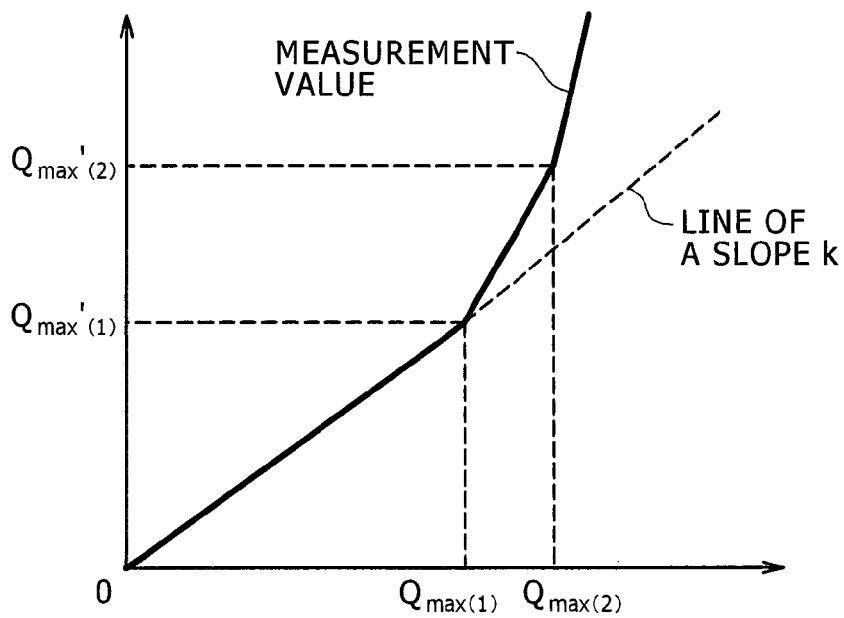
FIG. 19 is a view showing a correlation between partial discharge charge amounts when different test voltages are applied respectively.

FIG. 19 is a view showing a correlation between a partial discharge charge amount Qmax when a sine wave voltage is applied and a partial discharge charge amount Qmax' when the superimposed voltage including a sine wave with an impulse superimposed thereon is applied.

In the figure, the charge amount measured in the case where the sine wave voltage is increased from 0 V, as indicated on the horizontal axis, and a measurement result of the partial discharge charge amount when the voltage waveform shown in FIG. 13, having a peak voltage identical to the sine wave voltage, is applied, as indicated on the vertical axis, are plotted so as to correspond to each other.

The inventor, et al. have carried out various studies, and as a result, there has been obtained knowledge that if the sine wave voltage, and the voltage waveform shown in FIG. 13, at the peak voltage identical to the sine wave voltage, are each applied to an insulation object having an artificial void, partial discharge charge amounts (or voltage or current intensity if not converted into a charge amount) measured at the respective voltages will increase in proportional relation to a slope K (K is dependent on an insulation system)

Meanwhile, in the case where the winding of the rotating electric machine is actually a target for application of those voltages, if the partial discharge charge amounts exceed a partial discharge charge amount Qmax (1), and a partial discharge charge amount Qmax' (2) corresponding to the partial discharge charge amount Qmax (1), respectively, there occasionally occurs an abrupt increase in the partial discharge charge amount at the time when the voltage waveform shown in FIG. 13 is applied. Further, there can be the case where such a phenomenon as described occurs again if the partial discharge charge amounts exceed the partial discharge charge amount Qmax (2), and a partial discharge charge amount Qmax' (2) corresponding to the partial discharge charge amount Qmax (2), respectively. These phenomena show that partial discharge other than the partial discharge occurring inside the ground insulation occurs by application of the voltage waveform shown in FIG. 13.

As described earlier in Section "BACKGROUND OF THE INVENTION", if the steep pulse voltage of the inverter is applied to the winding of the rotating electric machine, a large voltage is applied to not only the ground insulation but also the corona preventive layer, or the electric field relaxation layer. As a result, it can be considered that the partial discharge accompanying those phenomena occurs when the voltage waveform shown in FIG. 13 is applied, so that the partial discharge charge amount has increased in proportional relation to, for example, the slope K.

In consequence of those studies, there has been obtained further knowledge that if which position on a curve shown in FIG. 19 the measurement result of the partial discharge charge amount is located can be recognized in the case where a prescribed voltage is applied, the partial discharge that has occurred at the time of application of the waveform shown in FIG. 13 (or the actual inverter voltage waveform) can be discriminated between the partial discharge occurring to the ground insulation (on a straight line of the slope K.) and partial discharge other than that (at a location off the straight line of the slope K.). Even with the use of this method, however, it is not possible to draw a distinction among the partial discharges occurring to the insulation between turns, the corona preventive layer, and the electric field relaxation layer, respectively.

Figure 20:
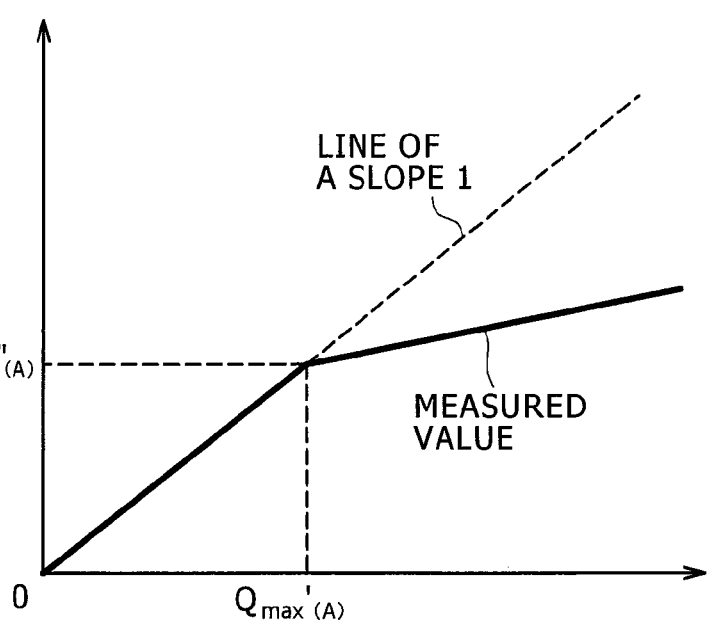
FIG. 20 is a view showing a correlation between the partial discharge charge amounts when different test voltages are applied respectively.

FIG. 20 is a view showing a correlation between the partial discharge charge amount Qmax' when the superimposed voltage including the sine wave with the impulse superimposed thereon, shown in FIG. 13, is applied, and a partial discharge charge amount Qmax" when the impulse voltage (the test voltage for the insulation between turns) shown in any of FIGS. 15 to 17 is applied. In the figure, the charge amount measured in the case where the voltage waveform shown in FIG. 13 is increased in similar waveform from 0 V is plotted on the horizontal axis, and a measurement result of a partial discharge charge amount when an impulse voltage $\Delta V$ shown in any of FIGS. 15 to 17, identical in magnitude to the impulse voltage $\Delta V$ in the voltage waveform applied at the time of the measurement on the partial discharge charge amount indicated on the horizontal axis, is plotted on the vertical axis in such a way as to correspond to each other.

Further, a characteristic shown in FIG. 20 depicts regions of partial discharge charge amounts in excess of the partial discharge charge amount Qmax (1), shown in FIG. 19, and Qmax' (1), corresponding to Qmax (1), respectively. With an example shown in FIG. 20, the partial discharge charge amount Qmax' at the time of application of the voltage waveform shown in FIG. 13, and the partial discharge charge amount Qmax" at the time of application of the impulse voltage shown in any of FIGS. 15 to 17 first increase substantially in proportional relation to a slope 1, whereas if the partial discharge charge amounts each exceed a charge amount Qmax' (A), and charge amount Qmax" (A) corresponding to Qmax' (A), respectively, the partial discharge charge amount Qmax" at the time of application of the impulse voltage shown in any of FIGS. 15 to 17 will cease increasing in a proportional relation to the slope 1 against the partial discharge charge amount Qmax' at the time of application of the voltage waveform shown in FIG. 13.

As described earlier, the sine wave voltage is hardly applied to the insulation between turns, and only the impulse voltage is applied thereto. In contrast, both the impulse voltage, and the sine wave voltage are applied to the corona preventive layer, and the electric field relaxation layer, respectively, thereby exposing both the layers to a severe voltage distribution, and it is therefore conceivable that if the partial discharge charge amount exceeds a certain value, a large partial discharge occurs to both the corona preventive layer, and the electric field relaxation layer, and the proportional relation to the slope 1 no longer exists. In consequence of those studies, there has been obtained still further knowledge that if it is possible to see which position on a curve shown in FIG. 20 the measurement result of the partial discharge charge amount is located when a prescribed voltage is applied, partial discharge that has occurred at the time of application of the waveform shown in FIG. 13 or the actual inverter voltage waveform can be discriminated between the partial discharge occurring to the insulation between turns (on a straight line portion of a slope 1), and the partial discharge occurring to the corona preventive layer, and the electric field relaxation layer (off the straight line of the slope 1).

Figure 21:
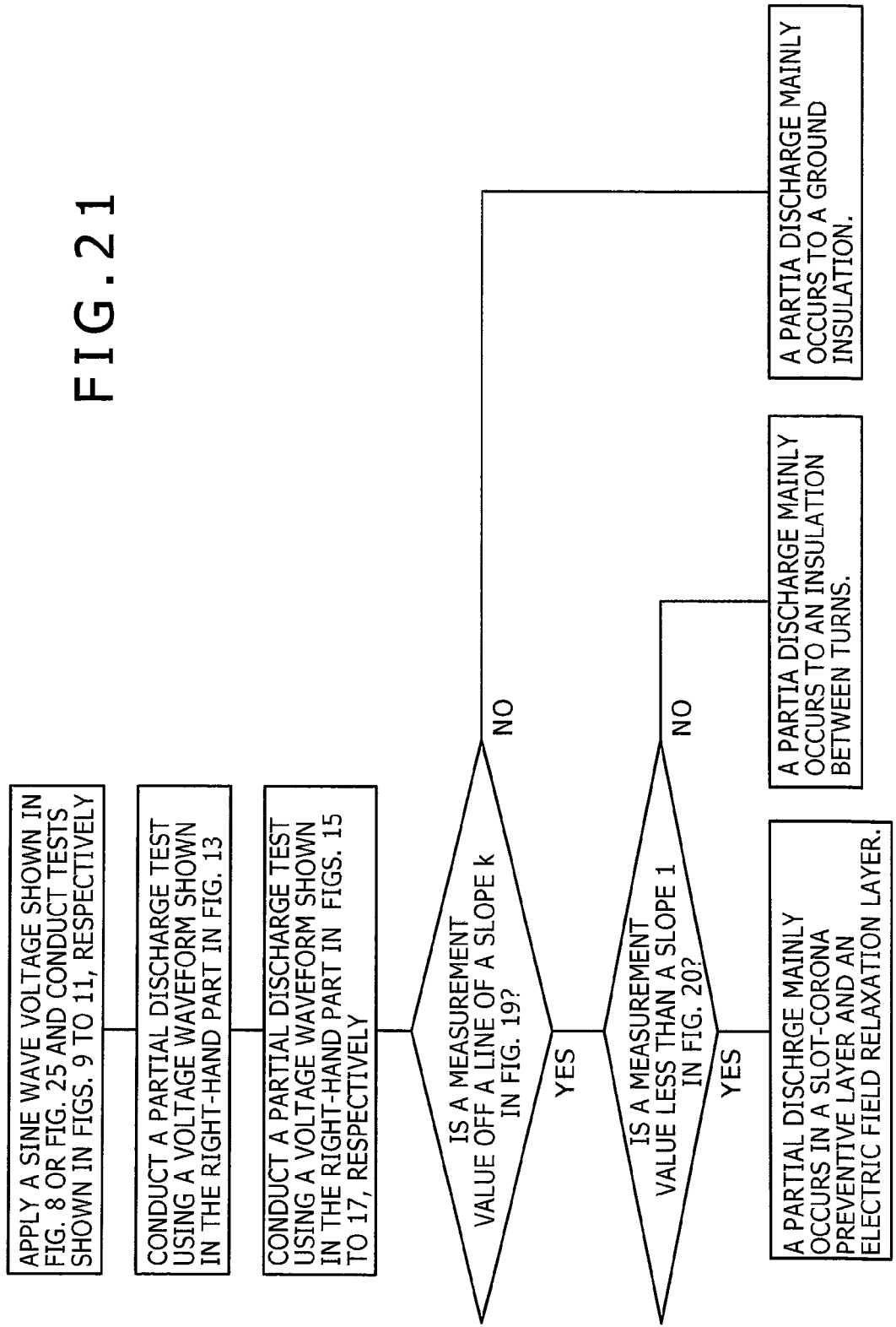
FIG. 21 is a view for describing a method for discriminating between the partial discharges described in the foregoing.

A method for discriminating between the partial discharges described as above is summed up, and is shown in FIG. 21 as a flow chart. In procedural steps shown in FIG. 21, there are conducted partial discharge tests at three voltages, respectively, the three voltages including the sine wave voltage, the superimposed voltage including the sine wave voltage with the impulse superimposed thereon, and the impulse voltage, thereby discriminating between the respective results of the tests. By so doing, it is possible to determine which part of the winding of the rotating electric machine will a problem, more specifically, to determine whether the part posing the problem at the time of the inverter driving is the ground insulation, the slot-corona preventive layer, and the electric field relaxation layer, or the insulation between turns.

Figure 22:
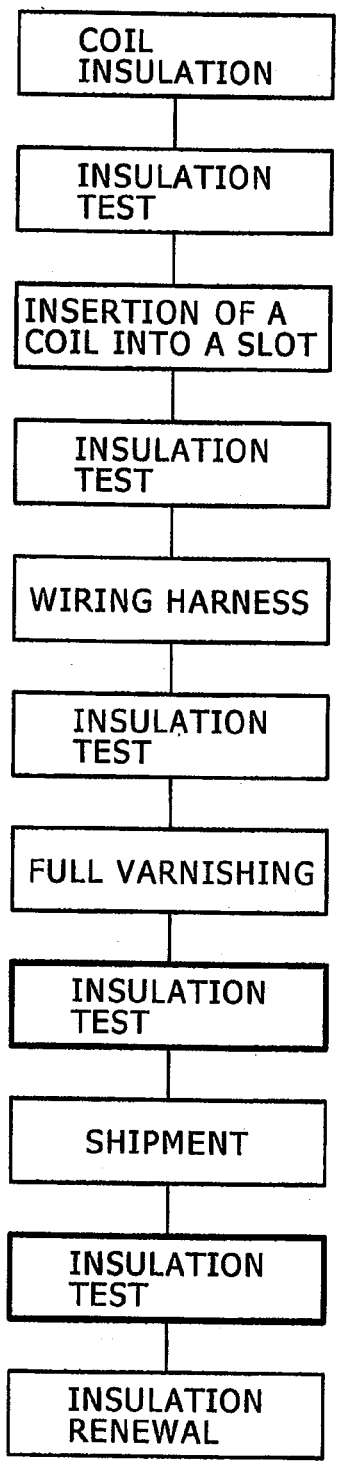
FIG. 22 is a view showing the steps of manufacturing a rotating electric machine up to insulation renewal.
Figure 23:
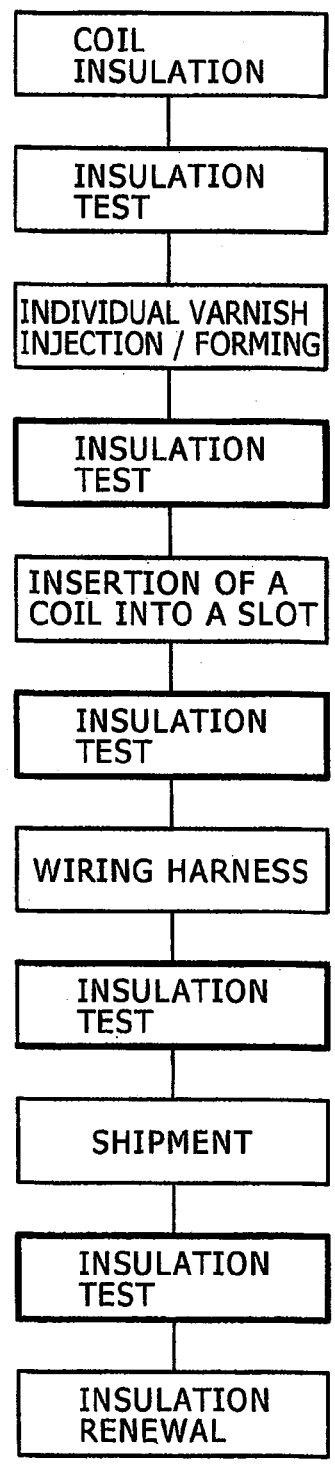
FIG. 23 is a view showing steps of manufacturing another rotating electric machine up to insulation renewal.

FIGS. 22, 23 each show a method for manufacturing an inverter drive rotating electric machine that is used in the insulation test, and a method for diagnosing insulation.

FIG. 22 is a view showing the steps of manufacturing a rotating electric machine for fully varnishing stator coils up to insulation renewal, and FIG. 23 is a view showing steps of manufacturing a rotating electric machine for forming a coil insulation by singly injecting a varnish, or resin-rich (prepreg) pressure forming up to insulation renewal. With the rotating electric machine for fully varnishing, a testing method according to the invention can be used for an insulation test after the stator windings are fully varnished as well as an insulation test after delivery. Accordingly, it is possible to secure insulation reliability as to the ground insulation, the insulation between turns', the slot-corona preventive layer, and the electric field relaxation layer, and to provide a rotating electric machine suited to inverter-driving.

Meanwhile, with the rotating electric machine for forming a coil insulation by individual varnish injection or resin-rich (prepreg) pressure forming, a coil is inserted in a slot after the individual varnish injection, or forming, and subsequently, coils are joined with each other to form a stator winding. Thereafter, the testing method according to the invention can be used for the insulation test after delivery. By so doing, it is possible to secure insulation reliability as to the ground insulation, the insulation between turns, the slot-corona preventive layer, and the electric field relaxation layer, and to provide a rotating electric machine suited to inverter-driving.

Second Embodiment

With a second embodiment of the invention, the configuration of the insulation test system and the inverter-rotating electric machine, shown in FIG. 1, is adopted for testing the rotating electric machine, as is the case with the first embodiment of the invention. With the second embodiment, however, an inverter drive rotating electric machine system is installed, a measurement is subsequently made on a peak value vp of an inverter voltage waveform to ground, occurring to the terminal of the rotating electric machine, and with the use of the peak value vp, a test voltage $V_{test}=vp/\sqrt{2}$ a is substituted for the conventional test voltage $E/\sqrt{3}$.

This voltage (the sine wave rms value voltage) is applied to the rotating electric machine, thereby making measurements on the AC voltage-current characteristic, the AC tan δ characteristic, and the AC partial-discharge characteristic. Further, for a test where the rated voltage E has been used for the test voltage in the past, the following is used as the test voltage:

$$V_{test}'=vp\cdot\sqrt{3}/\sqrt{2}$$

This voltage (the sine wave rms value voltage) is applied to the rotating electric machine, thereby making measurements on at least one of the insulation characteristics including the AC current characteristic, the tan δ characteristic, and the partial-discharge characteristic.

Figure 24:
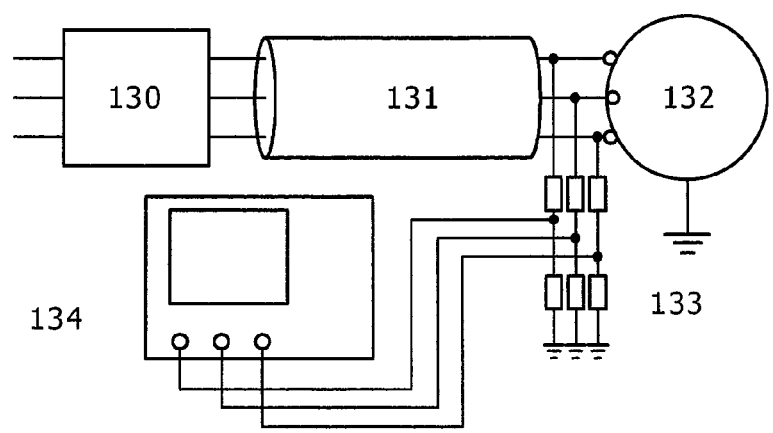
FIG. 24 is a view showing a circuit for measuring a voltage applied to a terminal of a rotating electric machine.

In FIG. 24, there is shown a circuit for measuring a ground voltage applied to the rotating electric machine at the time of inverter driving. When a rotating electric machine 132 is drive by an inverter 130, surge voltage (not shown) generated from the inverter 130 is propagated through a cable 131 to reach a rotating electric machine terminal, whereupon an overshoot occurs on the rising part of the surge voltage, due to impedance mismatching between the cable and the rotating electric machine, and an overvoltage is occasionally applied to the rotating electric machine. For this reason, in FIG. 24, a voltage applied to the rotating electric machine is measured at a terminal of the rotating electric machine. Further, in general, with the inverter drive rotating electric machine, an interphase voltage is often measured in order to remove effects of a common-mode voltage. However, in this case, a ground voltage actually applied to the ground insulation is measured. For measurements, use is made of a high-voltage probe or a voltage divider 133. It is preferable to use the high-voltage probe or the voltage divider 133, having a bandwidth BW (MHz)≥0.35/tr (µs) where "tr" is the rise time of the surge voltage of the inverter, further having an input impedance not less than 10 MΩ, higher than the ground impedance of a common rotating electric machine, and electrostatic capacity not more than 100 pF. A voltage measured by the high-voltage probe or the voltage divider 133 is further measured by a waveform observation unit 134 such as an oscilloscope, and so forth. The waveform observation unit 134 preferably has a bandwidth identical to, or not less than the bandwidth BW described as above. Further, in the case of A/D conversion, it is preferable to use the waveform observation unit 134 provided with an A/D converter having a sampling speed twice as high as that in the case of the bandwidth BW described as above, preferably at SS (MS/s)≥10/tr (µs), and quantized bit numbers being at least eight bits, or more.

Figure 25:
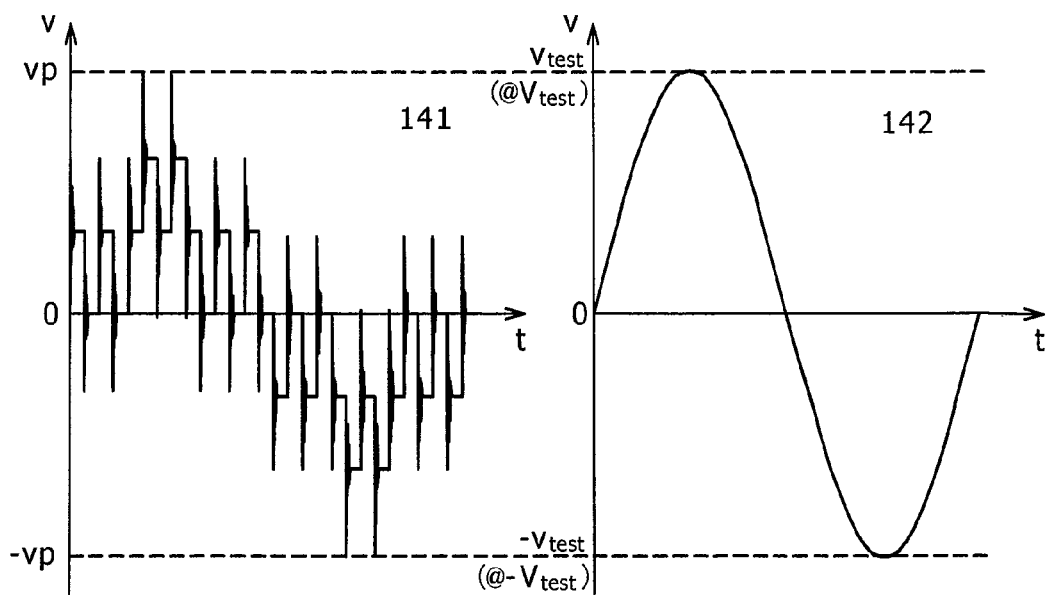
FIG. 25 is a view showing a relationship between a measured voltage waveform and a test voltage $V_{test}$.

FIG. 25 shows a relationship between a measured voltage waveform and a test voltage $V_{test}$ according to the second embodiment. With the inverter drive rotating electric machine according to the first embodiment, the test voltage for the ground insulation is decided on the basis of the ratio $\alpha(=t_{inv}/t_{sin})$ of the insulation thickness $t_{inv}$ of the inverter drive rotating electric machine to the insulation thickness $t_{sin}$ of the sine wave drive rotating electric machine at the same rated voltage. However, there are occasions when the ratio or the test voltage based on the ratio is not written in the maintenance manual of a rotating electric machine, and so forth. In such a case, the test voltage is decided on the basis of the inverter voltage vp actually applied to the rotating electric machine instead of the ratio or the test voltage based on the ratio.

There has already been obtained knowledge that with a rotating electric machine using an epoxy-mica insulation for a ground insulation, a peak voltage of an inverter voltage waveform generally has a large effect on a service life. For this reason, there is the case where if the effect of a recurring surge voltage is small, an insulation thickness of the ground insulation is designed to be larger by an increment of a rise in the peak voltage, as compared with the case of the sine wave driving. In such a case, an electric field distribution in the ground insulation layer at the time of application of the test voltage will end up identical to that shown in FIG. 8, as is the case with the first embodiment. However, if the insulation thickness is further increased in consideration of the effect of the recurring surge voltage, a test electric field according to the second embodiment will become lower than the test electric field shown in FIG. 8. In this case, an electric field of the ground insulation, at the time of application of the test voltage according to the second embodiment, is worked out after the test, and the electric field is preferably compared with data of the insulation tests conducted on the conventional commercial frequency sine wave drive rotating electric machine, in the same electric field, thereby making an insulation diagnosis pass/fail determination.

In general, the ground insulation degradation effects of a rotating electric machine coil is large in order of decreasing magnitude of heat>machine>electricity. The ground insulation degradation effects due to electricity degradation will somewhat increase according to a surge voltage at the time of the inverter driving, however, the order as above does not substantially change. Accordingly, it becomes important in the insulation diagnosis of the rotating electric machine coil to make adequate measurements on heat degradation, and machine degradation. With the first embodiment, in order that presence of an insulation defect accompanying the heat degradation, and the machine degradation in the ground insulation layer is determined on the basis of the conventional pass/fail criteria on insulation from this point of view, the test has been conducted at the test voltage at which the electric field equivalent in magnitude to the electric field in the conventional case is generated. However, with the heat degradation, and the machine degradation, in an advanced state, even if the electric field of the test voltage applied to the ground insulation layer is lower than the conventional test electric field level, it will become possible to determine the heat degradation, and the machine degradation. In such a case, even with the use of a testing method according to the second embodiment of the invention, the insulation diagnosis of the ground insulation of the rotating electric machine can be sufficiently made. Further, even in the case of the second embodiment, insulation diagnoses of others, such as the insulation between turns, the slot-corona preventive layer, and the electric field relaxation layer, respectively, are made according to the same method as the testing method according to the first embodiment.

Third Embodiment

With the second embodiment, the inverter drive rotating electric machine system has been first installed, and subsequently, the measurement has been made on the peak value vp of the inverter voltage waveform to the ground, occurring to the terminal of the rotating electric machine, thereby having decided the test voltage for the ground insulation by use of the peak value vp. In contrast, with the third embodiment, a peak value vp of the inverter voltage waveform to the ground, occurring to the terminal of the rotating electric machine, is predicted by simulation prior to the installation of the inverter drive rotating electric machine system, thereby deciding the test voltage for the ground insulation by use of the peak value vp.

Figure 26:
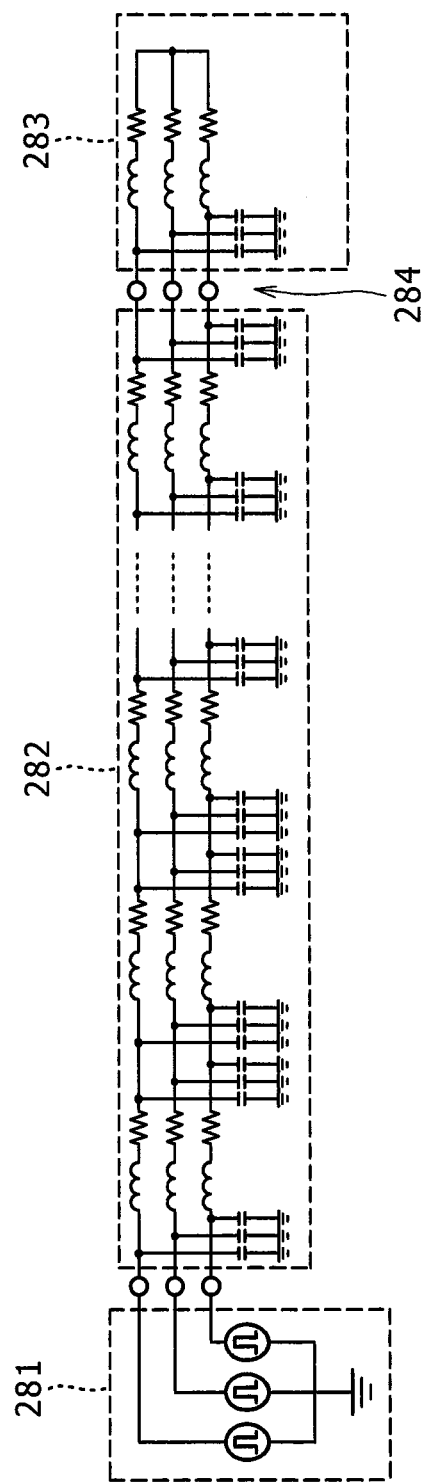
FIG. 26 is a view showing a simulation model of a voltage waveform to the ground, at the terminal of the rotating electric machine of an inverter drive rotating electric machine system by way of example.
Figure 27:
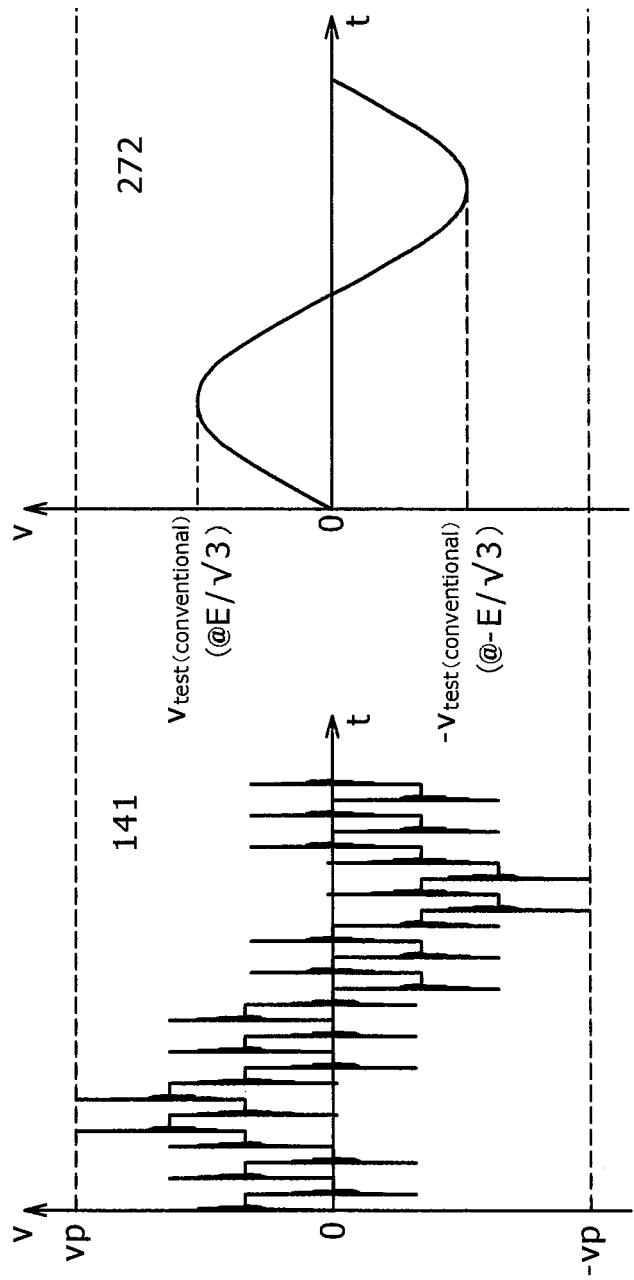
FIG. 27 is a view showing a voltage waveform at the time of inverter driving, and a test voltage waveform at $E/\sqrt{3}$ for comparison with each other.

FIG. 26 shows a simulation model of a voltage waveform to the ground, at the terminal of the rotating electric machine of an inverter drive rotating electric machine system by way of example. Herein, an inverter 281, a cable 282, and a rotating electric machine 283 are simulated to respective equivalent circuit models of resistance, inductance, capacitance and so forth, and a voltage at a predetermined rise time is inputted to the respective models, thereby calculating the voltage waveform of the rotating electric machine 284. Such a calculation is executed by use of a circuit simulation software application such as EMTP or Spice. Further, because the respective models considerably vary according to the inverter, the cable, and the rotating electric machine as a simulation subject, respectively, it is necessary to get hold of the specification of the rotating electric machine as a subject of the simulation, such as sizes in detail, values of material physical properties, and so forth, in advance.

As described in the foregoing, according to the embodiment of the in invention, assuming that the rated voltage of the armature winding of the rotating electric machine is E, and the ratio of the insulation thickness $t_{inv}$ of the inverter drive rotating electric machine to the insulation thickness $t_{sin}$ of the sine wave drive rotating electric machine is $\alpha(=t_{inv}/t_{sin})$, the sine wave rms value voltage not less than $V_{test}=\alpha \cdot E/\sqrt{3}$ or $V_{test}'=\alpha \cdot E$, as the test voltage $V_{test}$, is applied to the armature winding, thereby measuring the AC voltage-current characteristic, the AC tan δ characteristic, and the AC partial-discharge characteristic. Further, if the peak value vp of the inverter voltage waveform, occurring to the terminal of the rotating electric machine, can be measured, the sine wave rms value voltage based on the peak value vp, namely, vp/$\sqrt{2}$ or vp$\sqrt{3}$/$\sqrt{2}$, as the test voltage $V_{test}$, is applied to the armature winding, thereby measuring the AC voltage-current characteristic, the AC tan δ characteristic, and the AC partial-discharge characteristic. If the test voltage is set as above, this means that an electric field identical to the electric field applied to the ground insulation at the time of the ground insulation test for the conventional commercial frequency sine wave drive rotating electric machine is applied to the insulation layer. Accordingly, a test on the ground insulation of the inverter drive rotating electric machine can be conducted by use of the pass/fail criterion value, as it is, the pass/fail criterion being established from the past tests conducted on the conventional commercial frequency sine wave drive rotating electric machine as the test subject.

Further, on the basis of the correlation between the partial discharge charge amounts when at least two voltages of the three voltages including the sine wave voltage, the superimposed voltage including the sine wave voltage with the impulse superimposed thereon, and the impulse voltage are applied to the insulation between turns, the slot-corona preventive layer, and the electric field relaxation layer, it is possible to determine which of those parts will pose a problem at the time of the inverter driving, that is, to determine whether the part posing the problem is the ground insulation, the slot-corona preventive layer, the electric field relaxation layer, or the insulation between turns.

What is claimed is:

1. A rotating electric machine testing method comprising:
    applying a test voltage to an armature winding of the rotating electric machine; and
    testing insulation performance of the armature winding,
    wherein in the case where a rated voltage of the armature winding of the rotating electric machine is E, and an insulation test voltage of the armature winding of a sine wave voltage drive rotating electric machine at the rated voltage E is $E/\sqrt{3}$ or E, a test voltage $V_{test}$ applied to the armature winding of an inverter drive rotating electric machine is set to $V_{test}=\alpha \cdot E/\sqrt{3}$, or $V_{test}'=\alpha \cdot E$, respectively, provided that $\alpha(=t_{inv}/t_{sin})$, if an insulation thickness $t_{sin}$ of the sine wave drive rotating electric machine is $t_{sin}$, and an insulation thickness of the inverter drive rotating electric machine is $t_{inv}$, thereby conducting a test on any of an AC voltage-current characteristic, an AC tan δ characteristic, and an AC partial-discharge characteristic.

2. The rotating electric machine testing method according to claim 1, further comprising:
    acquiring a peak value vp of a voltage occurring to an terminal of an inverter drive rotating electric machine by measurements; and
    setting a sine wave voltage $V_{test}$ (vp/$\sqrt{2}$) having a peak value identical to the peak value vp to a test voltage $V_{test}$ on the basis of the peak voltage acquired, thereby conducting a test on any of the AC voltage-current characteristic, the AC tan δ characteristic, and the AC partial-discharge characteristic.

3. A rotating electric machine testing method comprising:
    applying a test voltage to an armature winding of the rotating electric machine; and
    testing insulation performance of the armature winding,
    wherein partial discharge charge amounts against respective voltages applied as a test voltage at the time of application of a sine wave voltage, and as a test voltage at the time of application of a superimposed voltage including the sine wave voltage with an impulse voltage superimposed thereon are measured, respectively, thereby discriminating between partial discharge at a ground insulation part of the armature winding, and partial discharges at an insulation between turns, a slot-corona preventive layer, and an electric field relaxation layer, respectively, on the basis of a change in a slope of a straight line expressing a correlation between the respective partial discharge charge amounts.

4. The rotating electric machine testing method according to claim 3, wherein partial discharge charge amounts against respective voltages applied as the test voltage at the time of application of the sine wave voltage, as the test voltage at the time of application of the superimposed voltage including the sine wave voltage with the impulse voltage superimposed thereon, and as a test voltage at the time of application of the impulse voltage are measured respectively, thereby discriminating between the partial discharge at the insulation between turns, and the partial discharges at the slot-corona preventive layer, and the electric field relaxation layer, respectively, on the basis of a change in the slope of the straight line expressing the correlation between the respective partial discharge charge amounts.

5. The rotating electric machine testing method according to claim 2, further comprising:
    predicting the peak value vp of the voltage occurring to the terminal of the inverter drive rotating electric machine through simulation.

6. A rotating electric machine comprising:
    an armature winding, a rated voltage of the armature winding of the rotating electric machine being E, while an insulation test voltage of the armature winding of a sine wave voltage drive rotating electric machine at the rated voltage E being $E/\sqrt{3}$ or E,
    wherein when a test voltage $V_{test}=\alpha \cdot E/\sqrt{3}$ (provided that $\alpha=t_{inv}/t_{sin}$) is applied to the armature winding of the inverter drive rotating electric machine if an insulation thickness of the sine wave drive rotating electric machine is $t_{sin}$ and an insulation thickness of an inverter drive rotating electric machine is $t_{inv}$, any of an AC voltage-current characteristic, an AC tan δ characteristic, and an AC partial-discharge characteristic, indicates a better characteristic in value than a value decided as the characteristic of the sine wave voltage drive rotating electric machine.

7. The rotating electric machine according to claim 6, wherein when a sine wave voltage $V_{test}$ (vp/$\sqrt{2}$) having a peak value identical to a peak value vp of a voltage occurring to an terminal of an inverter drive rotating electric machine, any of the AC voltage-current characteristic, the AC tan δ characteristic, and the AC partial-discharge characteristic, indicates a better characteristic in value than a value decided as the characteristic of the sine wave voltage drive rotating electric machine.

8. The rotating electric machine testing method according to claim 1, wherein an insulation test is conducted after varnishing of a stator winding, and after a shipment, respectively.

* * * * *